(12) United States Patent
Rathnayake

(10) Patent No.: US 9,318,716 B1
(45) Date of Patent: Apr. 19, 2016

(54) PROCESS FOR MAKING ELECTRONICALLY ACTIVE FUNCTIONALIZED SILSEQUIOXANE NANOSTRUCTURES OF CONTROLLED MORPHOLOGY THROUGH COVALENT SYNTHESIS

(71) Applicant: Hemali Rathnayake, Bowling Green, KY (US)

(72) Inventor: Hemali Rathnayake, Bowling Green, KY (US)

(73) Assignee: Western Kentucky University Research Foundation, Bowling Green, KY (US)

( * ) Notice: Subject to any disclaimer, the term of this patent is extended or adjusted under 35 U.S.C. 154(b) by 214 days.

(21) Appl. No.: 14/032,650

(22) Filed: Sep. 20, 2013

Related U.S. Application Data

(63) Continuation-in-part of application No. 13/275,771, filed on Oct. 18, 2011, now abandoned.

(51) Int. Cl.
| | | |
|---|---|---|
| C07F 7/10 | (2006.01) |
| H01L 51/50 | (2006.01) |
| H01L 51/00 | (2006.01) |
| H01L 51/42 | (2006.01) |

(52) U.S. Cl.
CPC ............ *H01L 51/0094* (2013.01); *H01L 51/42* (2013.01)

(58) Field of Classification Search
USPC ............................................ 546/14; 313/504
See application file for complete search history.

(56) References Cited

U.S. PATENT DOCUMENTS 8,412,468 B1    4/2013  Kessler

OTHER PUBLICATIONS

Zhang, T. et al.: Synthesis and properties of siloxane modified perylene bisimide discotic liquid crystals. Soft Matter, vol. 9, pp. 10739-10745, Sep. 6, 2013.*
Ren, Z. et al.: Tetrachloroperylene diimide functionalized reduced graphene oxide sheets and their I-V behavior by current sensing atomic force microscopy. J. Mater. Chem., vol. 22, pp. 18839-18846, 2012.*
Arkhireeva, et al., "A versatile route to silsesquioxane nanoparticles from organically modified silane precursors", Journal of Non-Crystalline Solids, 351, pp. 1688-1695 (2005).
Baney, et al., "Silsesquioxanes", Chemical Review, 95(5), pp. 1409-1430 (1995).
Brozek, et al., "Internal Functionalization and Surface Modification of Vinylsilsesquioxane Nanoparticles", Chemistry of Materials, 21(8), pp. 1451-1456 (2009).
Fu, et al., "Synthesis of a Polymeric Electron Acceptor Based on Perylenediimide-Bridged Ladder Polysiloxane", Macromolecules, 44(2), pp. 203-207 (2011).

Li, et al., "Fabrication of oriented zeolite L monolayers employing luminescent perylenediimide-bridged silsesquioxane precursor as the covalent linker", Chemical Communications, pp. 2853-2854 (2007).
Luo, et al., "Self-directed Assembly of Photoactive Perylenediimide-Bridged Silsesquioxane into a Superlong Tubular Structure", Chemistry of Materials, 17(9), pp. 2234-2236 (2005).
Ow, et al., "Bright and Stable Core-Shell Fluorescent Silica Nanoparticles", Nano Letters, 5(1), pp. 113-117 (2005).
Ren, et al., "Synthesis, Self-assembly, and Crystal Structure of a Shape-Persistent Polyhedral-Oligosilsesquioxane-Nanoparticle-Tethered Perylene Diimide", Journal of Physical Chemistry, 114(14), pp. 4802-4810 (2010).
Ribeiro, et al., "Synthesis and Characterization of Perylenediimide Labeled Core-Shell Hybrid Silica-Polymer Nanoparticles", Journal of Physical Chemistry, 113(42), pp. 18082-18090 (2009).
Saeki, et al., "Electrodeless Determination of Charge Carrier Mobility in Poly (3-hexylthiophene) Films Incorporating Perylenediimide as Photoconductivity Sensitizer and Spectroscopic Probe", Journal of Physical Chemistry, 112(42), pp. 16643-16650 (2008).
Sankaraiah, et al., "Preparation and Characterization of Surface-Functionalized Polysilsesquioxane Hard Spheres in Aqueous Medium", Macromolecules, 41, pp. 6195-6204 (2008).
Senkovskyy, et al., ""Hairy" Poly (3-hexylthiophene) Particles Prepared via Surface-Initiated Kumada Catalyst-Transfer Polycondensation", Journal of the American Chemical Society, 131, pp. 16445-16453 (2009).
Wahab, et al., "Photoactive Perylenediimide-Bridged Silsesquioxane Functionalized Periodic Mesoporous Organosilica Thin Films (PMO-SBA15): Synthesis, Self-Assembly, and Photoluminescent and Enhanced Mechanical Properties", Langmuir, 25, pp. 4743-4750 (2009).
K. Nozawa, et al.; Smart Control of Monodisperse Stober Silica Particles: Effect of Reactant Addition Rate on Growth Process; Journal; Oct. 29, 2004; Langmuir 2005; pp. 1516-1523, Issue 21; American Chemical Society; USA.
Werner Stober, et al.; Controlled Growth of Monodisperse Silica Spheres in the Micron Size Range; Journal; 1968 (received Aug. 3, 1967); pp. 62-69; Issue 26; Journal of Colloid and Interface Science; USA.
Rathnayake, et al.; Perylenediimide functionalized bridged-siloxane nanoparticles for bulk heterojunction organic photovoltaics; Nanoscale 4, 2012; pp. 4631-4640.
Rathnayake, et al.; Synthesis and characterization of poly(3-hexylthiophene)-functionalized siloxane nanoparticles; Nanoscale 5, 2013; pp. 3212-3215.

* cited by examiner

*Primary Examiner* — Charanjit Aulakh
(74) *Attorney, Agent, or Firm* — Middleton Reutlinger

(57) ABSTRACT

Disclosed is a composition comprising perylenediimide bridged dimethylethoxysilane. Disclosed also is an electronically active nanostructure comprising perylenediimide bridged dimethylethoxysilane. Disclosed also is a process for fabricating a photovoltaic device comprising depositing an electronically active nanostructure, the nanostructure made by hydrolysis and condensation of perylenediimide bridged dimethylethoxysilane, onto a substrate.

21 Claims, 15 Drawing Sheets

Left panel          Right panel

PDIB-Nanorods formed from Reaction 2 (Amount of base used 70.0 mmol)

PDIB-Nanorods formed from Reaction 3: Left- after 4hrs and Right - after 16 hrs (Amount of base used 130.0 mmol)

PROCESS FOR MAKING ELECTRONICALLY ACTIVE FUNCTIONALIZED SILSEQUIOXANE NANOSTRUCTURES OF CONTROLLED MORPHOLOGY THROUGH COVALENT SYNTHESIS

CROSS-REFERENCE TO RELATED APPLICATIONS

The instant application is a continuation-in-part of application Ser. No. 13/275,771, filed Oct. 18, 2011.

STATEMENT REGARDING FEDERALLY SPONSORED RESEARCH OR DEVELOPMENT

At least a portion of what is described herein may have been sponsored pursuant to one or more federal grants. Accordingly, the federal government may possess certain rights to what is described herein.

BACKGROUND OF THE INVENTION

Hybrid nanostructures derived from silica, or siloxanes have been the focus of intense research due to the unique possibilities to combine the properties of the organic moieties with those of the siloxane or silica matrix. (References 1-3.) Reliable synthesis of 2 to <100 nm sizes of these hybrid particles with a narrow average size distribution would provide opportunities to tailor organic moieties and polymer ligands (ranging from small molecules to functionalized molecules/dyes) in manners depending upon the applications. Difficulties in functionalization of nanoparticle surface with various types of ligands and difficulties in dispersion in specific polymer matrices are the key factors slowing down the use of ligand-functionalized nanoparticles into applications.

Recent research on organosilica hybrids, ormosils or silsesquioxanes and bridged silsesquioxanes has provided examples of tailoring various types of organic moieties onto particles for a wide variety of applications. (Refs. 1-3.) Such organosilica particles and/or bulk materials have potential applications as nano-fillers in polymer systems for use in adhesives, coatings, composites and dental fillings. (Ref. 3.) Significant advances have been made towards their use in fuel cells, optic devices, and sensors, much of which is carried out from bulk materials. (Refs. 2-4.) Recently, methods to take advantage of such hybrid nanoparticles have been much advanced by pioneering work from a few research groups. (Refs. 1d, 6, 7.) Nonetheless, it is highly desirable to tailor electronically active organic functionalities in such hybrids in terms of their potential applicability towards optoelectronic devices including photovoltaics. It would accordingly be desirable to prepare electronically active ligand-functionalized siloxane nanoparticles, such as a series of donor- and/or acceptor-functionalized siloxane and bridged-siloxane nanoparticles.

BRIEF SUMMARY OF THE INVENTION

An embodiment of the invention provides electronically active ligand-functionalized siloxane nanoparticles, such as a series of donor- and/or acceptor-functionalized siloxane and bridged-siloxane nanoparticles, showing favorable photovoltaic performance.

BRIEF DESCRIPTION OF THE SEVERAL VIEWS OF THE DRAWINGS

Reference to the figures discloses several aspects and/or embodiments of the invention and is not to be interpreted as limiting the scope of the invention.

FIG. 4(A) shows a transmission electron micrograph of perylenediimide-bridged siloxane nanoparticles according to the invention having average particle size of approximately 30 nm. FIG. 4(B) shows a transmission electron micrograph of perylenediimide-bridged siloxane nanoparticles according to the invention having average particle size of approximately 60 nm. FIG. 4(C) shows a transmission electron micrograph of perylenediimide-bridged siloxane nanoparticles according to the invention having average particle size of approximately 200 nm. FIG. 4(D) shows a transmission electron micrograph of perylenediimide-bridged siloxane nanoparticles according to the invention having average particle size of approximately 100 nm.

DETAILED DESCRIPTION OF THE INVENTION

The following detailed description of the invention is provided primarily for clearness of understanding of the invention. No unnecessary limitations are to be understood therefrom. To those skilled in the art, modifications will become obvious upon reading the disclosure and may be made without departing from the spirit of the invention and scope of the appended claims.

Embodiments of the invention are provided, inter alia, in various aspects, as enumerated below, yet solely for illustrative purposes, with equivalents clearly occurring to the person skilled in the art.

An embodiment of the invention provides, inter alia, electronically active ligand-functionalized siloxane nanoparticles, such as a series of donor- and/or acceptor-functionalized siloxane and bridged-siloxane nanoparticles.

An object of the invention was to prepare electronically active ligands-functionalized siloxane nanoparticles, for example, donor and/or acceptor-functionalized siloxane and bridged-siloxane nanoparticles having controllable size ranging from 30 nm to 300 nm. This involved developing better synthetic methodologies, designing novel, electronically active nanohybrids, assembling them in organic polymer matrices, and evaluating photovoltaic performance.

The usual method used to prepare organosilica hybrids is the well-known hydrolytic sol-gel route, which involves base or acid catalyzed hydrolysis and condensation reactions of monomeric alkoxysilane precursors in aqueous solvent systems. (Ref. 1.) The direct hydrolysis and condensation of dye-functionalized organotrialkoxysilane is one of the most effective ways to incorporate a higher load of fluorescent dyes to such nanoparticles. Moreover, this method provides opportunities to introduce more organic properties to an inorganic matrix and leads to a homogeneous solution with retained 3-D architecture in solution rather than nanoparticle aggregation observed in typical surface functionalized Stöber silica nanoparticles. (Ref. 8.) Since the organic functional groups of these hybrid particles can fulfill two functions, including modification of the inorganic core and resulting in improved compatibility with a host matrix (Ref. 1a), an object of the invention was to obtain a variety of organosilicas having fluorescence moieties including donors and acceptors. As the capability of chemically tailoring the surface of silica nanoparticles made from the Stöber method (Ref. 8) is limited due to their less surface coverage of ligands (less residual silanol groups) and the difficulties of having functionalization with specific ligands. The introduction of both reactive organic groups and fluorescence molecules to such siloxane networks according to the invention expands the scope of grafting/ligand chemistry.

Figure 1:
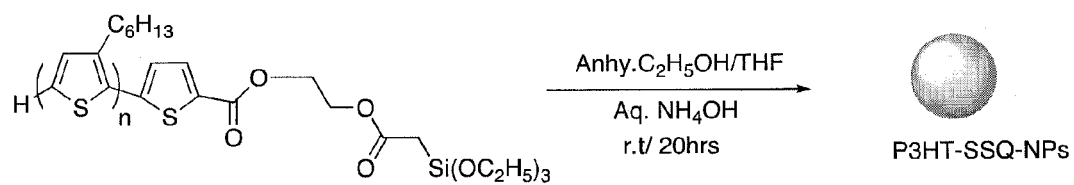
FIG. 1 shows an outline of a synthesis of poly(3-hexylthiophene) functionalized siloxane nanoparticles according to the invention.
Figure 2:
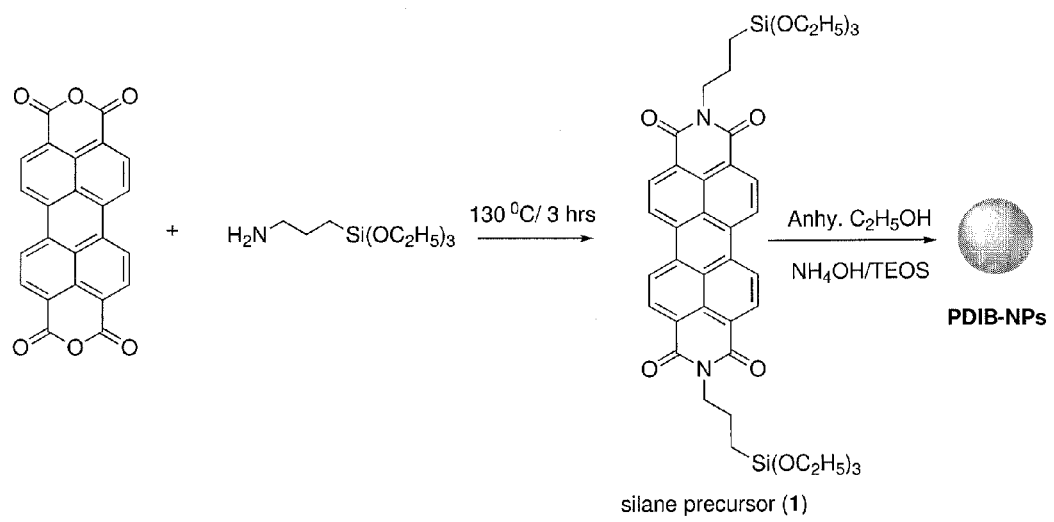
FIG. 2 shows a scheme for the preparation of perylenediimide-bridged siloxane nanoparticles according to the invention.

As depicted in FIGS. 1 and 2, in various embodiments of the invention, the inventor prepared two types of fluorescent siloxane nanoparticles derived from perylenediimide and polythiophene by base-catalyzed hydrolysis, and condensation of their respective silane precursors in the presence of tetraethoxysilane (TEOS) and ammonium hydroxide in anhydrous ethanol (or ethanol/THF or ethanol/chloroform solvent mixtures). Through this method, P3HT-functionalized siloxane (P3HT-SSQ) and perylenediimide-functionalized bridged siloxane (PDIB-SSQ) were prepared, isolated and characterized. The photophysical properties of these donor and acceptor functionalized nanohybrids were performed in solution phase.

Perylenediimide Functionalized Bridged-Siloxane (PDIB-SSQ) Nanoparticles:

Perylenediimide derivative functionalized bridged-siloxane (PDIB-SSQ) nanoparticles were prepared by adapting the modified Stöber method (Ref. 8) (direct hydrolysis and condensation of organotrialkoxysilanes). The synthetic steps for the preparation of the silane precursor and the respective fluorescent hybrids are depicted in FIG. 2. Starting from 3,4,9,10-tetracarboxyanhydrideperylene, the PDI silane precursor (1) was synthesized following the literature published procedure. (Ref. 9.) In a typical procedure, nanoparticles were prepared by base catalyzed hydrolysis and condensation of its respective silane precursor in the presence of tetraethoxysilane (TEOS) ranging from 13-20 mmol percent. While the particle size was controlled by the molar ratios of silane precursor to $NH_4OH$ to TEOS, slow drop feeding of the monomer into the reaction and the addition of TEOS controlled the particle regularity. In each trial, the reaction conditions were evaluated in order to develop a procedure that would be best suited for the production of a wide size range of nanoparticles. Since the inventor started from di-triethoxysilane precursor, perylenediimide units interconnected each other via a bridge of siloxane network, while co-condensing and hydrolyzing the triethoxysilane moiety to form a siloxane core structure. These nanoparticles are able to dissolve in most organic solvents to give homogeneous solutions from clear to opaque depending upon the size of particles.

Table 1 summarizes the best-suited amount of silane precursor, $NH_4OH$ and TEOS used, and an average particle size of each trial. It is shown that the base concentration has affected the particle size regularity. Likewise, the inventor was able to control the size of the particles ranging from 30 to 200 nm by changing the base concentration. The inventor performed a series of multiple trial reactions to study the effects of the base concentration on the particles' size distributions at the fixed molar ratios of other reagents. In general, nanoparticles obtained at low base concentrations were larger than those made at higher levels. Generally, increase in hydrolysis rates with increasing ammonia concentration leads to a higher nucleation rate, which results in larger number of particles in a smaller size range. The highest base concentration resulted in 30-50 nm particles, and lower base concentrations resulted in larger sized nanoparticles in the range of 90 nm to 200 nm.

TABLE 1

PDIB nanoparticle preparation: Reaction conditions, TGA characterization, and particle size distribution.

| PDI-bridged siloxane NPs | 28% $NH_4OH$ (aq) (mmol) | TEOS (mmol) | Average particle size (nm) | % Yield | % Organic $^a$EA | % Organic TGA |
|---|---|---|---|---|---|---|
| PDIB-1 | 200 | 0.12 | 37 ± 7 | 90 | 71.04 | 69 |
| PDIB-2 | 160 | 0.12 | 45 ± 6 | 88 | 70.72 | 69 |
| PDIB-3 | 120 | 0.18 | 100 ± 10 | 88 | 66.34 | 63 |
| PDIB-4 | 80 | 0.18 | 181 ± 17 | 85 | N/A | N/A |

*PDI-silane (1) moles used for each run = 0.24 mmol.

The FT-IR spectra of the particles confirmed the presence of characteristic bands for the formation of Si—O—Si bonds and the retention of Si—C linkages during the base-catalyzed hydroysis and condensation reaction. The alkyl chains —CH and weak carbonyl stretching vibrations were observed at 2933-2856 and 1766 $cm^{-1}$ respectively. The presence of aromatic C—C stretchings (1592-1649 $cm^{-1}$) and N—C vibrations (1441 $cm^{-1}$) further demonstrated the successful incorporation of perylenediimide units to siloxane network. The silsesquioxanes exhibited well-defined absorption at 1344-1415 $cm^{-1}$, indicating the presence of Si—C bonds in Si-perylenediimide units. The absorption of Si—O—Si was seen at 1067 $cm^{-1}$, evidencing the formation of a siloxane network. Thermogravimetric data analysis (TGA) confirms the higher load of ligand incorporation into the siloxane network. The % weight loss of organic content for each sample obtained by TGA is in reasonable agreement with the total % weight of organic content determined by elemental analysis (Table 1). The organic content percentages obtained from the elemental analyses were in reasonable agreement with the calculated values for all PDIB-NPs prepared using the modified Stöber method. The elemental analysis further confirmed the siloxane core is a silsesquioxane network with the formula of R—$Si_2O_3$ where R is $C_{30}H_{20}N_2O_4$.

Figure 4:
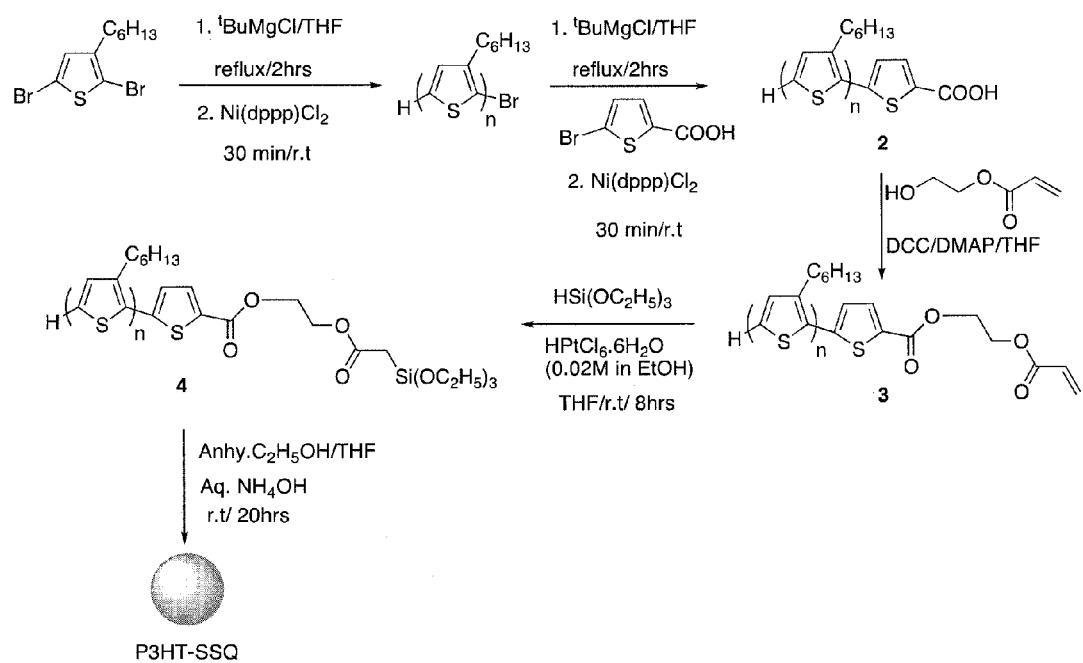
FIG. 4 shows a scheme for the preparation of poly(3-hexylthiophene) functionalized siloxane nanoparticles according to the invention.

P3HT-Functionalized Siloxane Nanoparticles (P3HT-SSQ):

The application of the modified Stöber method to prepare P3HT-functionalized silsesquioxane nanoparticles is depicted in FIG. 4. The silane precursor of P3HT 4 was prepared via subsequent synthetic steps starting from 2,5-dibromo-3-hexylthiophene. Bromide-terminated P3HT was prepared by Grignard metathesis (GRIM) polymerization as described by McCullough and co-workers, (Ref. 10) and followed by end capping with 5-bromo-2-thiophene carboxylic acid to obtain carboxylic acid-terminated P3HT 2. Upon the esterification of compound 2 with 2-hydroxyethylacrylate, the silane precursor 4 was prepared by hydrosilylation of compound 3 with triethoxysilane in the presence of 2 mol % chloroplatinic acid. The chemical structures of all intermediate products were confirmed by proton NMR and the silane precursor 5 was further confirmed by elemental analysis.

Preparation of P3HT-SSQ Nanoparticles:

P3HT-functionalized fluorescence hybrids were prepared by base-catalyzed hydrolytic condensation of P3HT-silane precursor 4 in the presence of aqueous ammonium hydroxide and TEOS (see Table 2 for reaction conditions for each trial). The effect of the reaction conditions such as reaction time, $NH_4OH$, TEOS and organotrialkoxysilanes concentrations, on the particle size and size distribution were studied in order to establish the best-suited conditions for the preparation of these hybrids. In order to get a maximum solubility of P3HT in ethanolic solution, the inventor used chloroform or THF in 1:1 ratio of anhydrous ethanol. However, the solvent mixture of $CHCl_3$:EtOH led to a better particle regularity with controlled particle size in the range of 30 nm to 120 nm compared to the results obtained from THF:EtOH solvent mixture. By varying the molar ratios of P3HT monomer to $NH_4OH$ concentration, the inventor was able to control the size of nanoparticles. The higher base concentrations gave smaller size particles whereas low base concentration gave larger size particles (see reaction 1-3 from Table 2).

Figure 3:
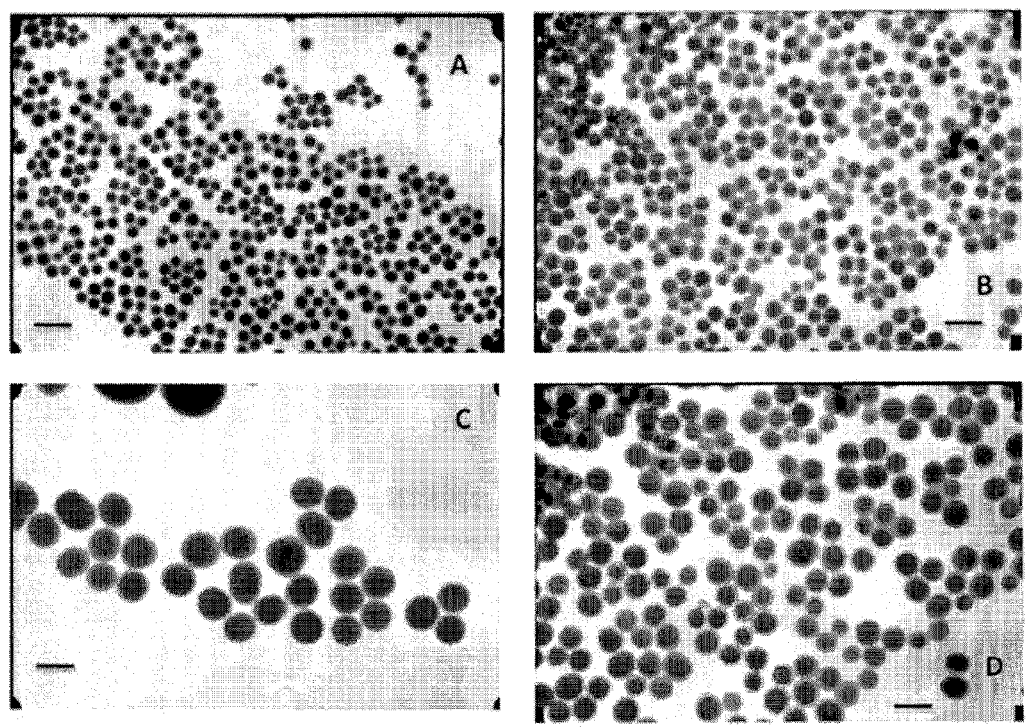
FIG. 3 shows transmission electron micrographs of perylenediimide-bridged siloxane nanoparticles according to the invention, relative to a scale bar of 200 nm.

FTIR spectroscopy confirmed the formation of Si—O—Si bonds and the retention of Si—C bonds during the hydrolysis and condensation of P3HT silane monomer and TEOS. These siloxane nanoparticles exhibited well defined Si—C stretching at 1376 $cm^{-1}$, aromatic C—C(from thiophene rings) stretching at 1454-1646 $cm^{-1}$, carbonyls stretchings at 1698 $cm^{-1}$, C—H alkyl stretching (from hexyl chain) at 2854-2922 $cm^{-1}$ and Si—O—Si stretching at 1082-1100 $cm^{-1}$ (see FIG. 3). TGA data showed that the % weight loss from organic content for each reaction was in reasonable agreement with the theoretical incorporation of organic content in all the nanohybrids prepared using modified Stöber method (Table 2). The inventor was able to incorporate up to 80% organic content into the siloxane core network using optimized experimental conditions. Table 3 summarizes the elemental analysis data and TGA data of two selected samples. The weight percentages for the organic content obtained from the elemental analysis are in reasonable agreement with the % weight loss from TGA data.

TABLE 2

Reaction conditions and average particle size distribution of siloxane nanoparticles

| P3HT-SSQ NPs | TEOS (mmol) | $NH_4OH$ (mmol) | Silane: TEOS (mole ratio) | % Weight Loss from TGA | % Yield | Avg. size (nm) |
|---|---|---|---|---|---|---|
| 1 | 0.072 | 40 | 1:2.29 | 28 | 92 | 60 ± 20 |
| 2 | 0.240 | 32 | 1:7.62 | 22 | 45 | 80 ± 40 |
| 3 | 0.240 | 48 | 1:7.62 | — | 45 | 45 ± 25 |
| 4 | 0.240 | 16 | 1:4.49 | 54 | 81 | 50 ± 20 |
| 5 | 0.0202 | 80 | 1:0.64 | 58 | 64 | 400 ± 20 |
| 6 | 0.0101 | 80 | 1:0.32 | 70 | 58 | 440 ± 10 |
| 7 | 0.0067 | 80 | 1:0.21 | 80 | 50 | 100 ± 10 |

*P3HT-silane mmoles used for each run was $3.15 \times 10^{-2}$ mmol except for reaction 4; silane mmoles used in reaction 4 was $5.35 \times 10^{-2}$ mmol. Solvent mixtures: For reaction 1-4, $CHCl_3$: $C_2H_5OH$ (anhydrous) and for reaction 5-7, THF: $C_2H_5OH$ were used.

TABLE 3

Elemental analysis and TGA data for two selected samples

| Samples | (% weight from elemental analysis) | | | Total % weight of Organic content (from elemental analysis) | Total % weight of organic content from TGA |
|---|---|---|---|---|---|
| | C | H | S | | |
| 1 | 24.86 | 4.15 | 6.30 | 35.31 | 28 |
| 4 | 43.34 | 6.20 | 7.31 | 56.85 | 54 |

Figure 5:
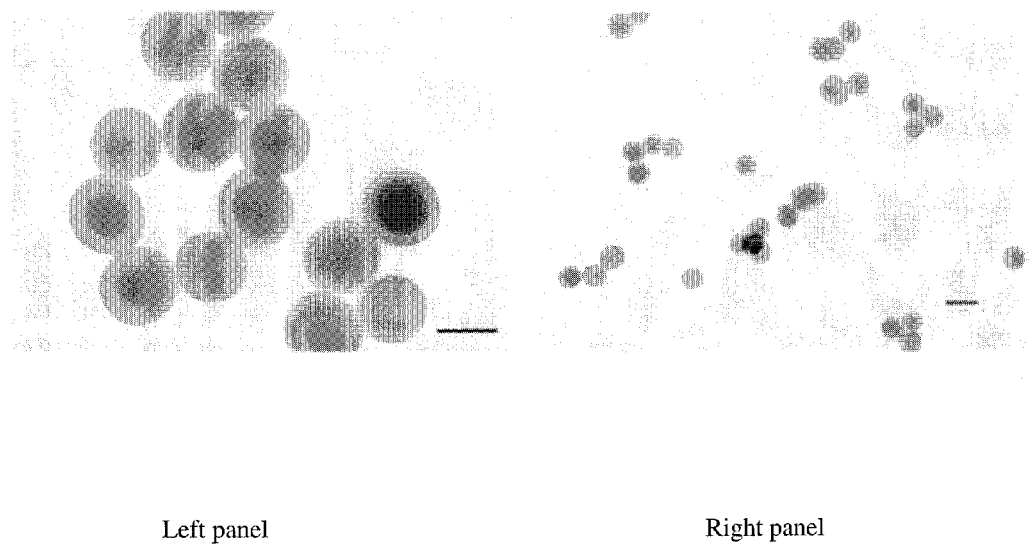
FIG. 5 shows transmission electron micrographs of poly(3-hexylthiophene) functionalized siloxane nanoparticles according to the invention. The left panel of FIG. 5 shows a transmission electron micrograph of poly(3-hexylthiophene) functionalized siloxane nanoparticles according to the invention having an average particle size of approximately 120 nm, relative to a scale bar of 200 nm. The right panel of FIG. 5 shows a transmission electron micrograph of poly(3-hexylthiophene) functionalized siloxane nanoparticles according to the invention having an average particle size of approximately 80 nm, relative to a scale bar of 100 nm.

The size and the shape of these nanoparticles were visualized using transmission electron microscopy (TEM) and are shown in FIG. 5.

Accordingly, in an embodiment, the invention provides a plurality of types of fluorescence and electronically active bridged-siloxane and siloxane nanoparticles, for example, containing perylenediimide and poly(3-hexylthiophene) derivatives, by base catalyzed hydrolysis and condensation. Such a process according to the invention is useful to incorporate higher content of organic dyes into the silica network thus obtaining the highly fluorescent donor/acceptor functionalized nanoparticles, which exhibit fluorescence from both periphery and the core. Such a process according to the invention is not limited to specific ligands, but may be applied broadly to any appropriately functionalized silane precursor to make hybrid nanostructures of various sizes and compositions with siloxane or bridged-siloxane core structure. Such a process according to the invention is useful to make reactive group functionalized fluorescent hybrids for grafting chemistry.

A plurality of P3HT nanoparticles according to the invention in close proximity to a plurality of PDI nanoparticles according to the invention show an efficient charge transfer between P3HT and PDI nanohybrids in P3HT/PDI-SSQ blends. Accordingly, a plurality of nanoparticles according to the invention is useful to resolve morphological problems encountered in organic solar cells from the blends of P3HT and low molecular weight perylenediimide as bulk materials.

The invention is further described, inter alia, in the following exemplary aspects:

Aspect 1. An electronically active nanoparticle comprising a plurality of atoms of each of silicon, carbon, and oxygen, wherein at least a substantial portion of the plurality of carbon atoms are disposed within one or more Ligands, and at least a substantial portion of the plurality of silicon atoms are disposed within -((Ligand)$_2$SiO)-repeating units and -((Ligand)$SiO_{1.5}$) -repeating units, wherein the one or more Ligands comprise an electron donor, an electron acceptor, or an electron donor and an electron acceptor.

Aspect 2. An electronically active nanoparticle according to aspect 1, wherein the nanoparticle comprises, by mass, at least about 20% of the one or more Ligands.

Aspect 3. An electronically active nanoparticle according to aspect 1, wherein the nanoparticle comprises, by mass, at least about 50% of the one or more Ligands.

Aspect 4. An electronically active nanoparticle according to aspect 1, wherein the nanoparticle comprises, by mass, at least about 80% of the one or more Ligands.

Aspect 5. An electronically active nanoparticle according to aspect 1, wherein the one or more Ligands comprise an electron donor.

Aspect 6. An electronically active nanoparticle according to aspect 1, wherein the one or more Ligands comprise an electron acceptor.

Aspect 7. An electronically active nanoparticle according to aspect 1, wherein the one or more Ligands comprise an electron donor and an electron acceptor.

Aspect 8. An electronically active nanoparticle according to aspect 5, wherein the electron donor is a poly(3-alkylthiophene).

Aspect 9. An electronically active nanoparticle according to aspect 8, wherein the poly(3-alkylthiophene) is poly(3-methylthiophene) or poly(3-hexylthiophene).

Aspect 10. An electronically active nanoparticle according to aspect 8, wherein the electron donor is poly(3-hexylthiophene).

Aspect 11. An electronically active nanoparticle according to aspect 6, wherein the electron acceptor is perylenediimide or [6,6]-N-methylpyrrolidine C60 phenylacrylate.

Aspect 12. An electronically active nanoparticle according to aspect 6, wherein the electron acceptor is perylenediimide.

Aspect 13. An electronically active nanoparticle according to aspect 7, wherein the electron donor is poly(3-hexylthiophene) and the electron acceptor is perylenedimmide.

Aspect 14. An electronically active nanoparticle according to aspect 10, wherein the nanoparticle comprises, by mass, at least about 50% poly(3-hexylthiophene).

Aspect 15. An electronically active nanoparticle according to aspect 10, wherein the nanoparticle comprises, by mass, at least about 80% poly(3-hexylthiophene).

Aspect 16. An electronically active nanoparticle according to aspect 12, wherein the nanoparticle comprises, by mass, at least about 50% perylenediimide.

Aspect 17. An electronically active nanoparticle according to aspect 12, wherein the nanoparticle comprises, by mass, at least about 70% perylenediimide.

Aspect 18. An electronically active nanoparticle according to aspect 10, wherein the particle size is between about 20 nm and about 450 nm.

Aspect 19. An electronically active nanoparticle according to aspect 12, wherein the particle size is between about 30 nm and about 200 nm.

Aspect 20. An electronically active nanostructure made by base-catalyzed hydrolysis of a triethoxysilyl precursor in which an electronically active moiety is covalently bound via a carbon-silicon bond to the silicon atom of the triethoxysilyl precursor, wherein the triethoxisilyl precursor is subjected to base-catalyzed hydrolysis in the presence of tetraethoxysilane and ammonium hydroxide.

Aspect 21. A process for making an electronically active nanostructure, the process comprising base-catalyzed hydrolysis of a triethoxysilyl precursor in which an electronically active moiety is covalently bound via a carbon-silicon bond to the silicon atom of the triethoxysilyl precursor, wherein the triethoxisilyl precursor is subjected to base-catalyzed hydrolysis in the presence of tetraethoxysilane and ammonium hydroxide, forming the electronically active nanostructure.

Aspect 22. An optoelectronic device comprising one or more layers each comprising an electronically active nanoparticle according to aspect 1.

Aspect 23. An optoelectronic device comprising two or more layers each comprising an electronically active nanoparticle according to aspect 1.

Aspect 24. An optoelectronic device comprising three or more layers each comprising an electronically active nanoparticle according to aspect 1.

Aspect 25. An optoelectronic device comprising, within one layer, an electronically active nanoparticle according to aspect 5 and an electronically active nanoparticle according to aspect 6.

Equivalents to the foregoing aspects will be readily apparent to the person skilled in the art.

For example, a nanoparticle according to the invention may comprise any of a wide variety of optically active ligands such as para-phenylvinylenes (PPVs), and para-phenylethynes (PPEs).

A process according to the invention may be practiced using any of a number of substitutes for the reagents employed. For example, according to the invention, one may introduce multiple functional groups/ligands onto the nanoparticle surface by using different silane precursors.

Similarly, ranges recited in various aspects are ranges that the person skilled in the art may rightly identify as capable of further extension, whether those ranges pertain, by way of example and not of limitation, to various reaction conditions, particle size, etc.

The following experimental details further illustrate, but do not limit or demarcate, the breadth of the invention.

EXPERIMENTAL DETAILS

Materials 2,5-dibromo-3-hexylthiophene, 3,4,9,10-tetracarboxyanhydrideperylene, tert-butylmagnesiumchloride (1M in THF), 2-hydroxyethylacrylate, 2-carboxyethylacrylate, DMAP, DCC, chloroplatinic acid hexahydrate, n-butyllithium (1.6M in hexanes), 5-bromo-2-thiophene carboxylic acid and anhydrous tetrahydrofuran were obtained from Aldrich chemicals. Ammonium hydroxide (28%) was obtained from Fischer Scientific. Triethoxysilane, tetraethoxysilane, dichloro[bis(1,3-diphenylphosphino)propane]nickel(II) [Ni(dppp)Cl$_2$] and 3-aminopropyltriethoxysilane were purchased from Alfar Aesar and used as received. Unless otherwise specified, all chemicals were used as received.

Characterization.

Proton NMR spectra were recorded on a 500 MHz Jeol using CDCl$_3$, deuterated toluene and d$_6$-DMSO as solvents. FTIR spectra were measured using a Perkin-Elmer Spectrum One FT-IR spectrometer equipped with a universal ATR sampling accessory. Elemental analysis was conducted by Atlantic Microlab, Inc., (6180 Atlantic Blvd, Norcross, Ga. 30071). Transmission electron microscopy (TEM) observations were performed on a 100CX JEOL at 80 keV. Thermogravimetric analysis was performed at Thermal Analysis Laboratory at Western Kentucky University. The samples were analyzed by a TA Q5000TGA. The samples were held isothermal at room temperature for 30 min and then heated from room temperature to 650° C. at 10° C./min in nitrogen. The purge gas was heated at 10° C./min to 800° C. The photophysical properties in solution were performed on fluorescence spectrometer (Perkin Elmer LS 55) and UV-visible spectrometer (Perkin Elmer, Lambda 35).

PDI-Bridged Silane Precursor 1:

To a two-necked round bottom flask, 3,4,9,10-tetracarboxyanhydrideperylene (1.0 g, 2.24 mmol) and excess 3-aminopropyltriethoxy silane, 3-APT (3 mL) were added and heated at 120° C. for three hours under argon atmosphere. The resulted red thick solution was dispered in hexane and filtered. The precipitate was dissolved in chloroform (~20 mL) and insoluble solid was removed by gravity filtration. The filtrate was concentrated in vacuum to yield red solid (850 mg, Yield=57%). $^1$H-NMR in CDCl$_3$ {δ, ppm}: 8.64 (2H, d), 8.57 (2H, d), 4.20 (2H, t), 3.82 (12H, s), 1.87 (2H, m), 1.21 (9H, t), 0.79 (2H, t); FT-IR stretchings (cm$^{-1}$): 2943-2881 (C—H stretching of alkyl chains), around 1756 (carbonyl stretching), 1592-1692 (aromatic C—C stretching's), 1441 (weak, N—C stretching from perylenediimide), 1233 (Si—C stretching's) and 1014 (Si—O—); Elemental analysis (%): Experimental—C, 63.15, H, 6.36, N, 3.45. Calculated—C, 63.13, H, 6.31, N, 3.51.

Typical Procedure for the Preparation of PDIB-SSQ Nanoparticles:

Ammonium hydroxide (28% in water, 10 mL, 80 mmol) and TEOS (0.05 mL, 0.12 mmol) were added into a 250 mL flask containing 125 mL of anhydrous ethanol. Then PDI silane monomer (191 mg, 0.24 mmol) in THF (2 mL) was slowly added to the reaction mixture and stirred about 20 hours at room temperature. With time, the reaction mixture turned to cloudy suspension. The nanoparticles were isolated by repeated centrifugation, and redispersion in ethanol, then dried under a stream of air, to obtain the particles as a red powder (212 mg, 88%, average size ~35 nm); FTIR (cm$^{-1}$): 2933-2856 (C—H stretching of alkyl chains), around 1766 (weak, carbonyl stretching), 1592-1649 (aromatic C—C stretching's), 1441 (weak, N—C stretching from perylenediimide), 1344 (Si—C stretching's) and 1067 (Si—O—Si stretching from siloxane network); TGA: 69% weight loss at 430° C.; Elemental analysis (%): Experimental—C, 63.03, H, 4.10, N, 4.75. Calculated—C, 62.48, H, 3.50, N, 4.86.

General Procedure for the Preparation of Carboxylic Acid Terminated P3HT, 2:

Anhydrous THF (30 mL) was injected into a 250 mL three-necked round bottom flask previously flushed with argon containing poly(3-hexyl thiophene) (1.755 g, 0.108 mmol). Slowly, t-BuMgCl (1.0M, 1.627 mL, 1.627 mmol) was added and the mixture was refluxed at 80° C. for 2.0 hrs under argon atomosphere. The yellow solution was then cooled to room temperature and Ni(dppp)Cl$_2$ (0.013 g, 0.025 mmol) was added at once and the system was flushed with argon. Then a dry solution of 5-bromo-2-thiophene carboxylic acid (0.337 g, 1.627 mmol) in dry THF (5 mL) was added via syringe to the reaction mixture and stirred another 45 min at room temperature. The reaction was quenched with methanol (1 mL) and was poured into methanol (50 mL). The mixture was filtered and the solid was washed with hexane until the filtrate turned to colorless. The resulted solid was dried to yield a reddish-black solid (1.535 g, Yield=78.2%). $^1$H-NMR in CDCl$_3$ {δ, ppm}: 7.44 (s (weak, br), 1H), 7.29 (s, (weak, br), 1H), 6.97 (s, 97H), 6.82 (s (weak), 1H, terminal H), 2.80 (s (br), 180H), 1.77-1.34 (m, 900H), 0.91 (s, 323H); FT-IR stretchings (cm$^{-1}$): 3354-3000 (—OH from carboxylic acid), 2921-2854 (alkyl C—H), 1694 (carbonyl, weak), 1604-1509 (aromatic C—C), 1449 and 819 (S—C). Molecular weight (MW) of the polymer was determined by $^1$H-NMR spectrum with respect to terminal hydrogen of P3HT polymer chain end; MW=16,200 g/mol.

Carboxyethylacrylate Chain End-Functionalized P3HT, 3:

Anhydrous THF (30 mL), carboxylic acid-terminated P3HT, 2 (1.500 g, 0.089 mmol), 2-hydroxyethyl acrylate (0.176 mL, 1.533 mmol), DCC (0.345 g, 1.673 mmol), and catalytic amount of DMAP (0.020 g) were combined in a 100 mL single-necked round bottom flask and stirred for 16 hrs at room temperature. The resulting suspension was filtered and the filtrate was concentrated in vacuum. The solid was washed with hexane and filtered to yield a black solid (1.400 g, Yield=87.6%). $^1$H-NMR in CDCl$_3$ {δ, ppm}: 7.44 (s (weak, br), 1H), 7.28 (s, (weak, br), 1H), 6.97 (s, 105H), 6.82 (s (weak), 1H, terminal H), 2.79 (s (br), 211H), 1.69-1.33 (m, 1000H), 0.94 (s, 381H); FT-IR stretchings (cm$^{-1}$): 2922-2854 (alkyl C—H), 1694 (carbonyl, weak), 1604-1511 (aromatic C—C), 1449 and 820 (S—C).

Poly(3-Hexyl Thiophene) Carboxy Triethoxysilane, (P3HT-Acrylate Silane Precursor), 4:

Anhydrous THF (30 mL) was injected into a flask previously flushed with argon containing compound 4 (1.200 g, 0.084 mmol). Slowly, triethoxysilane (0.170 mL, 0.934 mmol) was added dropwise. A separately made dry 0.02 M solution of chloroplatinic acid (0.103 g, 0.199 mmol) in anhydrous ethanol (10 mL) was slowly added to the reaction mixture. The reaction stirred for 16 hrs at room temperature under inert gas atmosphere and was concentrated in vacuum to half volume. The solution was diluted with THF (~5-10 mL) and added dropwise into hexane. The resulting suspension was centrifuged and the crude product was collected to yield a purple-black solid (1.020 g, Yield=75.7%). $^1$H-NMR in CDCl$_3$ {δ, ppm}: 7.43 (s, weak, br, 1H), 7.29 (s, (weak, br), 1H), 6.97 (s, 92H), 6.82 (s (weak), 1H, terminal H), 3.64 (s, weak, 3H), 2.80 (s (br), 188H), 1.80-1.34 (m, 997H), 0.91 (s, 331H); FT-IR stretchings (cm$^{-1}$): 3368 (OH from trace amount of methanol wash), 2922-2855 (alkyl C—H), 1696 (ester carbonyl from acrylate), 1636-1512 (aromatic C—C), 1452 and 817 (S—C), 1157 (Si—C), 1068 (Si—O—) and 815.86.

General Procedure for the Preparation of P3HT-Acrylate-SSQ Nanoparticles:

Anhydrous ethanol (200 proof, 15 mL) and ammonium hydroxide (28%, 30 mL) was added at once into a one-necked round bottom flask containing chloroform (45 mL). Then tetraethoxysilane (0.0126 g, 0.06 mmol) was added into the flask at once. The flask was capped and a ventilation needle was added through the septa. Two phases appeared in the reaction flask, which was vigorously stirred until the lower phase became a milky, white color. A previously mixed (by sonication) solution of P3HT-acylate silane (0.050 g, 0.0315 mmol) in chloroform (15 mL) was added at once into the reaction flask. The lower phase became purple while the upper phase remained mostly clear. As reaction time progressed, the upper phase began to become purple until there was a homogenous purple color throughout the solution. The reaction was continued for 24 hrs. The two layers (chloroform layer and ethanol layer) were separated via a separatory funnel and the choroform layer was centrifuged to yield a purple solid. The procedure resulted in 60 nm average size particles confirmed by TEM. FT-IR stretchings (cm$^{-1}$): 3243 (OH from hydrolyzed silanol groups), 2923-2855 (alkyl C—H), 1696 (ester carbonyl from acrylate), 1636-1512 (aromatic C—C), 1437 and 813 (S—C), 1040 (Si—O—Si).

Photovoltaic Performance of PDIB-Nanoparticles According to the Invention.

Derivatives of PDI are acceptors for use in bulk heterojunction organic photovoltaics due to the high electron mobility of their crystalline domains. However, recent work on bulk heterojunction devices made from blends of poly(3-hexylthiophene) (P3HT) and derivatives of PDI exhibit low external power conversion efficiencies, generally just below 0.2%. (Ref. 12.) The formation of micrometer-sized PDI crystals upon annealing is a possibility for low external power conversion. (Ref. 13.) The present invention provides an increase in power conversion while avoiding the formation of micrometer-sized PDI domains. As the invention provides PDI nanohybrids, the inventor employed nano-sized crystalline PDI nanohybrids and evaluated the photovoltaic performance of the blends of PDIB-NPs and P3HT polymer. As the invention provides PDIB-NPs, the inventor also established that incorporation of PDI units into a siloxane network had favorable effects on photovoltaic performance. Test devices were prepared by mixing different ratios of PDIB-NPs with P3HT polymer. Test devices made from 50 w/w % of PDIB to P3HT mixture showed particularly favorable photovoltaic performance upon annealing at 130° C. for the relative active area of 1 cm$^2$ with $J_{SC}$ of 5.25 mA/cm$^2$ at $V_{OC}$ of 0.52-0.54 V, a fill factor (calculated) FF of 0.38 and PCE achieved up to date is 0.71-0.90%. It will be apparent to one skilled in the art that routine optimization of conditions may further improve measured device efficiency.

Device Preparation and Characterization:

Model bulk heterojunction solar cell devices were prepared on glass/ITO substrates. The substrates were subsequently cleaned in 2-propanol and acetone in ultrasonic bath for 15 minutes each and a thin layer of PEDOT:PSS (purchased from Aldrich) with a thickness of ~70-80 nm was spin-coated as a hole-transporting layer on top of ITO. The substrates were heated at 100° C. in a vacuum oven for an hour. As a first step the active layer of PDIB-NPs:P3HT (polymer molecular weight=10,000 g/mol) with two different ratios (1:1 and 2:1) dissolved in chlorobenzene (15 mg/mL concentration of each compound for the 1:1 blend) was spincoated at a rotational speed of 1000 rpm. The substrates were transported into vacuum evaporator and a layer of LiF (~1 nm) and Al (~200 nm) was thermally evaporated on top of the active layer with a diameter of 2 mm of coating area through a mask. The final devices were annealed in a vacuum oven at different temperatures for fifteen minutes. The testing of the devices was performed using a solar simulator with an emission spectrum close to AM1.5G and intensity of 150 W/m$^2$. The measurements were carried out under ambient conditions: 45±5% relative humidity and 75±2° C. under the sun simulator. The IV curves of the devices were measured using a Keithley 2400 sourcemeter controlled by a PC.

Further Aspects of the Invention

In other performance evaluations, a photoconversion efficiency of up to 2.6% was attained under the following conditions: $J_{SC}$ 7.5 mA/cm$^{-2}$, $V_{OC}$ 0.54 V, FF 0.38-0.52.

For use in a photovoltaic device, a blend ratio of PDIB-NPs:P3HT may be 50% or 75%, as described above. A blend ratio of PDIB-NPs:P3HT may also be 25% or lower. A blend ratio of PDIB-NPs:P3HT may also be 80% or higher. A blend ratio of PDIB-NPs:P3HT may also be 90% or higher.

Bulk P3HT may be used a donor, as described above. P3HT-NPs, which the inventor has herein taught how to make, may also be used as a donor. One skilled in the art will recognize how to blend PDIB-NPs and P3HT-NPs for use in a photovoltaic device.

A device configuration of ITO/PEDOT.PSS/Blend/LiF/Al may be employed, as described above. A device additionally having a hole transport layer within its structure is within the scope of the invention. A device additionally having an electron transport layer within its structure is within the scope of the invention.

To make a blend of PDI-NPs and P3HT for use in a photovoltaic device, an annealing temperature of 130 C was attained, as described above. An annealing temperature of 50 C or higher is within the scope of the invention. An annealing temperature of 100 C or higher is within the scope of the invention. An annealing temperature of 140 C or higher is within the scope of the invention. An annealing temperature of 150 C or higher is within the scope of the invention.

A photoconversion efficiency of 5% or higher is attained through optimization of the above-described conditions.

The following references have been referred to in the foregoing. Each reference is incorporated herein by reference. Should there be any conflict between the content of the current specification and any of the references, the current specification shall control.

REFERENCES 1. (a) Arkhireeva, A.; Hay, J. N.; Oware, W.; Journal of Non-Crystalline Solids 2005, 351, 1688-1695. (b) Van Blaaderen, A.; Vrij, A.; Langmuir 1992, 8, 2921-2931. (c) Ow, H.; Larson, D. R.; Srivastava, M.; Baird, B. A.; Webb, W. W.; Wiesner, U.; Nano Lett. 2005, 5 (1), 113-116. (d) Lihua Zhao, L.; Loy, D. A.; Shea, K. J.; J. Am. Chem. Soc. 2006, 128, 14250-14251. (e) Sankaraiah, S.; Lee, J. M.; Kim, J. H.; Choi, S. W.; Macromolecules 2008, 41, 6195-6204.
2. Ueda, M.; Kim, H. B.; Ikeda, T.; Ichimura, K.; J. Mater. Chem. 1995, 5, 889. (b) Arkhireeva, A.; Hay, J. N.; Polym. Polym. Comp. 2004, 12, 101.
3. Shea, K. J.; Loy, D. A.; Chem. Mater. 2001, 13, 3306. (b) Seog, I. S.; Kim, C. H.; J. Mater. Sci. 1993, 28, 3277. (c) Iwamoto, T.; Mackenzie, J. D.; J. Sol-Gel Sci. Tech. 1995, 4, 141. (d) Hay, J. N.; Porter, D.; Raval, H. M.; J. Mater. Chem. 2008, 10, 1811. (e) Ou, D. L.; Seddon, A. B.; J. Non-Cryst. Solids 1997, 210, 187.
4. Noda, I.; Kamoto, T.; Yamada, M.; Chem. Mater. 2000, 12, 1708. (b) Baumann, F.; Schmidt, M.; Deubzer, B.; Geck, M.; Dauth, J.; Macromolecules 1994, 27, 6102. (c) Noda, I.; Isikawa, M.; Yamawaki, M.; Sasaki, Y.; Inorg. Chim. Acta 1997, 263, 149. (d). Noda, I.; Kamoto, T.; Sasaki, Y.; Yamada, M.; Chem. Mater. 1999, 11, 3693. (e) Ottenbrite, R. M.; Wall, J. S.; Siddiqui, J. A.; J. Am. Ceram. Soc. 2000, 83, 3214. (f) Arkhireeva, A.; Hay, J. N.; Polym. Polym. Comp. 2004, 12, 101. (g) Arkhireeva, A.; Hay, J. N.; Manzano, M.; Masters, H.; Oware, W.; Shaw, S. J.; J. Sol-Gel Sci. Tech. 2004, 31, 31. (h) Arkhireeva, A.; Hay, J. N.; Chem. Mater. 2005, 17, 875. (i) Tiarks, F.; Landfester, K.; Antonietti, M.; Langmuir 2001, 17, 5775.
5. Hatakeyama, F.; Kanzaki, S. J. Am. Ceram. Soc. 1990, 73, 2107-10. (b) Yacoub-George, E.; Bratz, E.; Tiltscher, H. J. Non-Cryst. Solids 1994, 167, 9-15. (c) Silva, C. R.; Airoldi, C. J. Colloid Interface Sci. 1997, 195, 381-387. (d) Reynolds, K. J.; Colon, L. A. J. Liq. Chromatogr. Relat. Technol. 2000, 23, 161-173. (e) Etienne, M.; Lebeau, B.; Walcarius, A. New J. Chem. 2002, 26, 384-386. (f) Yin, R.; Ottenbrite, R. M.; Siddiqui, J. A. Polym. Prepr. 1995, 36, 265-6.
6. Ha, S-W.; Camalier, C. E.; Beck Jr., G. R.; Lee, J-K.; Chem. Commun. 2009, 2881-2883.
7. Muthukrishnan, S.; Plamper, F.; Mori, H.; Müller, A. H. E.; Macromolecules 2005, 38, 10631-10642. (b) Mori, H.; Lanzendorfer, M. G.; Müller, A. H. E.; Macromolecules 2004, 37, 5228-5238.

8. Stöber, W.; Fink, A.; Bohn, E.; J. Colloid Interface Sci. 1968, 26, 62.
9. Wahab, M. A.; Hussain, H.; He, C. Langmuir 2009, 25, 4743-4750.
10. Loewe, R. S.; Khersonsky, S. M.; McCullough, R. Advanced Materials 1999, 11, 250.
11. Linder, S. M.; Thelakkat, M. Macromolecules 2004, 37, 8832-8835.
12. Dittmer, J. J.; Marseglia, E. A.; Friend, R. H.; Adv. Mater. 2000, 12, 1270.
13. (a) Rajaram, S.; Armstrong, P. B.; Kim, B. J.; Fréchet, J. M.; Chem. Mater. 2009, 21, 9, 1776. (b) Li, J.; Dierschke, F.; Wu, J.; Grimsdale, A. C.; Müllen, K.; J. Mater. Chem. 2006, 16, 96. (c) Shin, W. S.; Jeong, H. -H.; Kim, M. -K.; Jin, S. -H.; Kim, M. -R.; Lee, J. -K.; Lee, J. W.; Gal, Y. -S.; J. Mater. Chem. 2006, 16, 384.

Further Description of a Process for Making Electronically Active Functionalized Silsesquioxane Nanostructures of Controlled Morphology Through Covalent Synthesis The hierarchical assembly of nanoscale building blocks with tunable dimensions and structural complexities is essential for controlling the distinctive geometry of 1D-structures. These particular dimensional nanomaterials are utilized for a variety of nanostructure applications, including high-strength nanocomposites, field-emitting surfaces, sensors, nanotransistors, biomaterial delivery tools, optical devices, electrode materials, energy storage devices, and catalysts. Great efforts have been made to develop techniques to produce unique 1D-structures, such as laser-assisted catalytic growth, solution-liquid-solution techniques, template directed synthesis, and self-assembly processes from noncovalent interactions.

Among different types of 1D-nanomaterials, organic nanostructures have gained interest due to their distinct optical, electrical, and mechanical properties. The general method of preparing organic nanomaterials is through noncovalent interactions such as hydrogen bonding, π-π stacking, and solvophobic and surface effects. To date, a variety of supramolecular architectures has been fabricated by molecular self-assembly of tailored, supramolecular building blocks.

Significant research efforts have been reported for the self-organization of perylenediimides (PDIs) into 1D-structures such as nanofibers, nanowires, and nanoribbons. The planar π-conjugated aromatic framework of PDIs makes them ideal moieties for supramolecular self-assembly into discrete nanomaterials through strong π-π interactions. To fabricate PDIs into 1D nanostructures through self-assembly, cofacial π-π stacking is beneficial. Zhang and co-workers have demonstrated that cofacial π-π stacking between molecular skeletons requires the assembly of PDI into ID structures (Acc. Chem. Res. 2008, 41, 1596-1608). A variety of techniques such as phase transfer, solvent annealing, vapor diffusion, and seeded growth were introduced to generate nanobelt, nanowires, and nanofibers from PDI systems that would otherwise form bulky aggregates.

Figure 6:
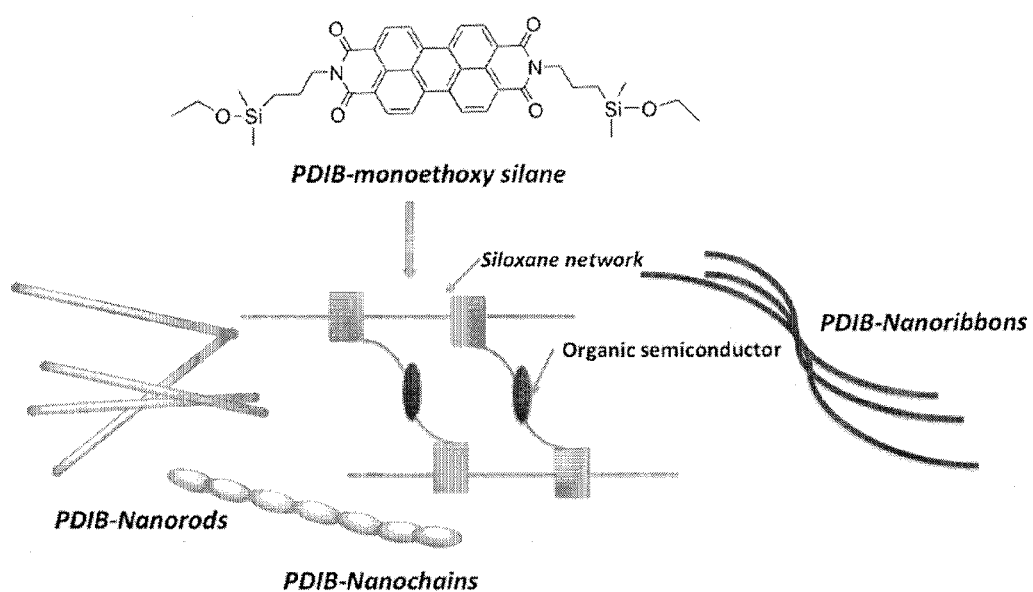
FIG. 6 shows a schematic representation illustrating PDI-nanostructures (nanoribbons and nanorods) prepared from PDI-functionalized silane precursors. "PDIB-silane" refers to perylenediimide bridged dimethylethoxysilane.

However, achieving nanosized structures with distinct geometries via self-organization processes is a great challenge and has limited control over the morphology of final structure. Alternatively, the covalent synthesis is an advantage over self-assembly processes for making well-defined three-dimensional nanostructures with controlled morphologies. Herein is taught inter alia a method to prepare 1D-nanostructures varied from nanoribbons to nanochains to nanorods via covalent synthesis. As depicted in FIG. 6, perylenediimide-functionalized silsesquioxane nanoribbons, nanochains, and nanorods were prepared by based-catalyzed hydrolysis and condensation of its respective organo-monoalkoxy silane precursor. The methods developed here build on our previously published work on preparing poly(3-hexylthiophene)- and perylenediimide-functionalized silsesquioxane nanoparticles (Nanoscale 2012, 4, 4631-4640; Nanoscale 2013, 5, 3212-3215). In the present work, nanoribbons (PDIB-Nanoribbons) were prepared by base-catalyzed hydrolysis of PDIB-dimethylmonoethoxysilane precursor. Upon changing the base concentration, the resulted morphology varies from nanoribbons to nanorods to nanochains. The comparative studies of photophysical properties in solution phase, thin-film morphologies, and single nanostructure fluorescence detected circular dichroism (FDCD) were performed to investigate the structure-property relationship between PDI moieties and silsesquioxane core structure on morphology control. The photovoltaic performances of PDIB-nanoribbons and nanorods were also evaluated by blending with a donor polymer, poly(3-hexylthiophene).

EXPERIMENTAL SECTION

Materials 3,4,9,10-tetracarboxydianhydrideperylene, regioregular poly(3-hexylthiophene) (average $M_n$ 30,000-60,000 g/mol), anhydrous ethanol (200 proof), chloroform (HPLC grade), and chlorobenzene (HPLC grade) were obtained from Aldrich chemicals. Ammonium hydroxide (28%) was obtained from Fischer Scientific. 3-Aminopropyltriethoxysilane and 3-aminopropyldimethylethoxysilane were purchased from Gelest Inc. Unless otherwise specified, all chemicals were used as received.

Characterization.

Proton NMR spectra were recorded on a 500 MHz Jeol using CDCl3 as a solvent. FTIR spectra were acquired using a Perkin-Elmer Spectrum One FT-IR spectrometer equipped with a universal ATR sampling accessory. Transmission electron microscopy (TEM) observations were performed on a 100CX JEOL at 80 keV. The elemental compositions (C, H, and N) of the silane precursor were analyzed by Micro-Elemental Analysis Lab at Advanced Materials Institute, Western Kentucky University.

PDIB-Dimethylethoxysilane.

Figure 7:
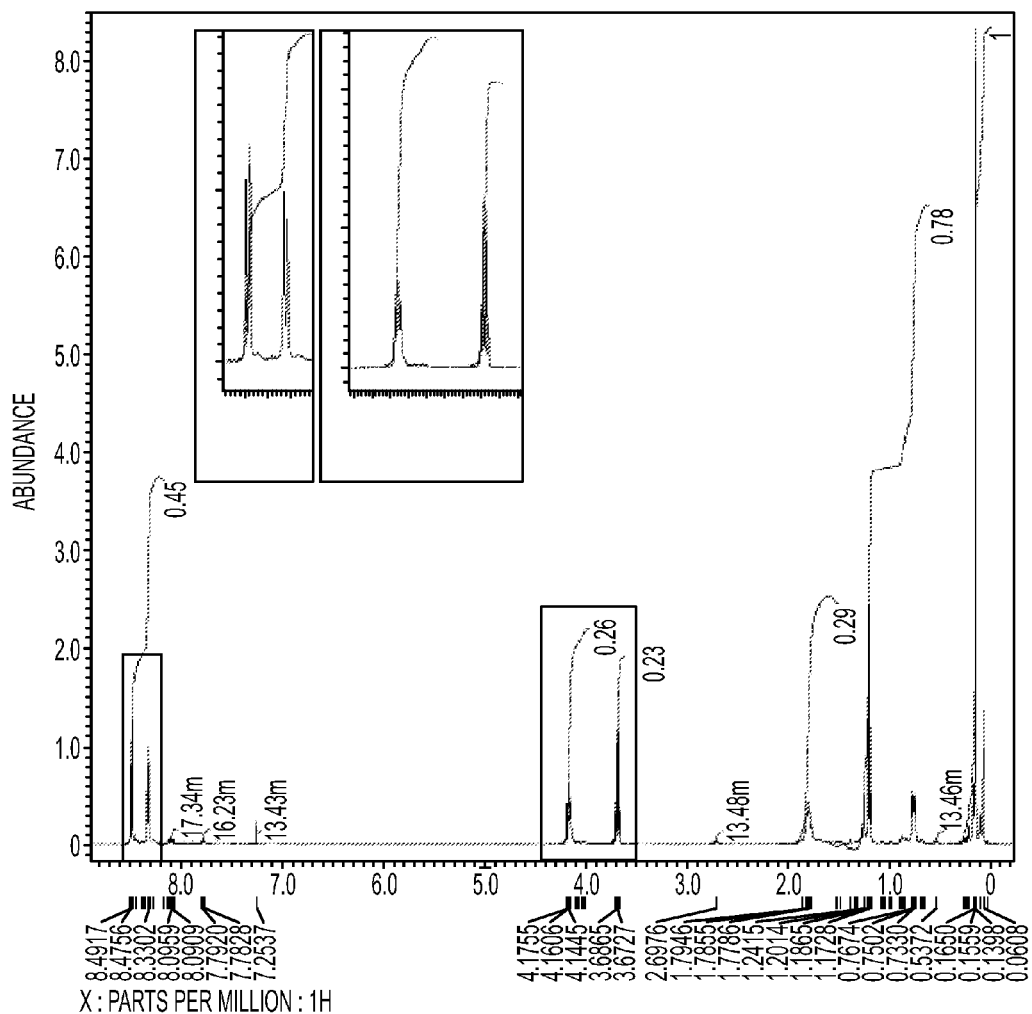
FIG. 7 shows a 1H-NMR spectrum of PDIB-silane.
Figure 8:
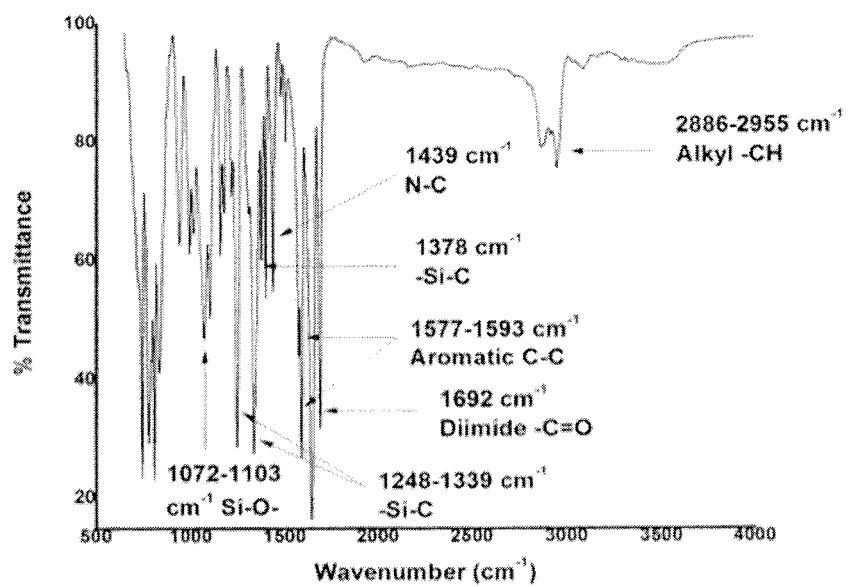
FIG. 8 shows a FTIR spectrum of PDIB-silane.

"PDIB-dimethylethoxysilane" refers to perylenediimide bridged dimethylethoxysilane. To a three-necked round bottom flask, 3,4,9,10-tetracarboxydianhydrideperylene (0.49 g, 1.12 mmol) and anhydrous ethanol (50.0 mL) were added and heated to reflux under argon atmosphere. Then excess 3-aminopropyldimethylethoxysilane (2.0 g, 12.4 mmol) was added and continued refluxing for 24 hours. The resulted dark red solid was washed with hexane and ethanol to remove excess 3-aminopropyldimethylethoxysilane. The dark red solid was dissolved in chloroform (~50 mL) and insoluble solid was removed by centrifugation and gravity filtration. The filtrate was concentrated in vacuum to yield a dark red solid (500 mg, yield=59%). As shown in FIG. 7, 1H-NMR in CDCl3 {δ, ppm}: NMR, 8.49-8.47 (2H, d), 8.33-8.31 (2H, d), 4.17-4.14 (2H, t), 3.70-3.65 (2H, q), 1.82-1.76 (2H, m), 1.20-1.17 (3H, t), 0.76-0.73 (2H, t), 0.14 (16H, s). As shown in FIG. 8, FTIR stretchings (cm$^{-1}$): 2955-2886 (C—H stretching of alkyl chains), 1692 (diimide carbonyl stretching), 1593-1577 (aromatic C—C stretching), 1439 (N—C stretching from perylenediimide), 1378-1248 (Si—C stretching), 1103-1072 (Si—O—). Elemental analysis (%): experimental—C, 66.8, H, 6.26, N, 4.04. Calculated—C, 67.2, H, 6.2, N, 4.1.

Typical Procedure for the Preparation of PDI-Nanoribbons:

To a 250 mL round bottom flask, the PDI-dimethylsilane monomer (~200 mg, 0.29 mmol) in chloroform (15 mL) was added through the microfilter under argon atmosphere. Anhydrous ethanol (150 mL) and ammonium hydroxide (14.45 M—28% in water, 20 mL, 290 mmol) mixture were added slowly to form two layers and react for 48 hours. The nanoribbons were isolated by repeated centrifugation and repeated redispersion in ethanol. After totally dried in stream air, the nanoribbons were collected as a red solid (Yield 56%). FTIR stretching (cm$^{-1}$): 2993-2885 (C—H stretching of alkyl chains), 1692 (diimide carbonyl stretching), 1593-1558 (aromatic C—C stretching), 1440 (N—C stretching from perylenediimide), 1379-1250 (Si—C stretching), 1098-1016 (Si—O—).

Typical Procedure for the Preparation of PDI-Nanorods:

To a 100 mL round bottom flask, anhydrous ethanol (37.5 mL) and ammonium hydroxide (14.45 M—28% in water, 5 mL, 70 mmol) were added under argon atmosphere. The base concentration was adjusted to 1.48 mol/L by adding 2.5 mL of water. Then the PDI-dimethylsilane monomer (~50 mg, 0.07 mmol) in chloroform (3.75 mL) was slowly added through the microfilter to the reaction mixture and stirred for 48 hours at room temperature. The nanorods were mostly stayed in the supernatant after the very first centrifugation, which removes the unreacted fibrous material. Followed by repeated centrifugation, the nanorods with nanoparticles were collected as a red solid. The yield was low (~20%) since nanorods were unable to separate completely from the solution and tend to stay in the solution.

Device Fabrication.

Model bulk heterojunction solar cell devices were prepared on glass/ITO substrates. The substrates were subsequently cleaned in 2-propanol and acetone in ultrasonic bath for 15 minutes each and a layer of PEDOT:PSS (purchased from Aldrich) with a thickness of ~400-500 nm was spray-deposited as a hole transporting layer on top of ITO under stream of nitrogen atmosphere. The substrates were heated at 100° C. in a vacuum oven for an hour. As a first step, the active layer of PDIB-naostructures: P3HT (average $M_n$=30,000-60,000 g/mol) dissolved in chlorobenzene (10 mg/mL concentration of each compound of 1:1 ratio) was spray-deposited to give a film thickness of 300-400 nm under stream of nitrogen atmosphere. The substrates were transported into vacuum evaporator and a layer of calcium (~2 nm) and aluminum (~50 nm) was thermally evaporated on top of the active layer with a diameter of 2×6 mm of coating area through a mask. The final devices were annealed inside the glove box at 100° C. for five minutes followed by transferred to a glass chamber under stream of nitrogen gas and sealed the chamber for device characterization. The testing of the devices was performed using a solar simulator with an emission spectrum close to AM 1.5G and intensity of 80 W/m$^2$. The IV curves of the devices were measured using a Keithley 2400 sourcemeter. The fill factor (FF) and power conversion efficiency (PCE) were calculated manually using following two equations.

$$FF = \frac{J_m V_m}{J_{sc} V_{oc}} \quad PCE = \frac{J_{sc} V_{oc} FF}{P_s}$$

where $P_s$ is intensity of light

Results and Discussion

Figure 9:
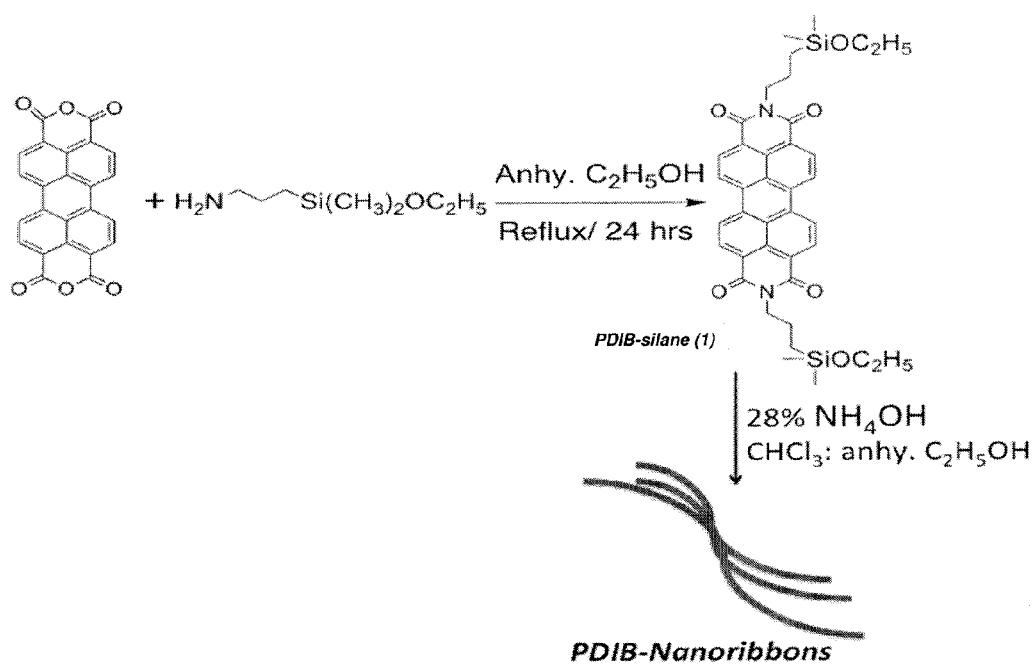
FIG. 9 shows a scheme for the preparation of PDIB-nanoribbons, wherein PDIB-dimethylethoxysilane was synthesized from 3,4,9,10-tetracarboxyanhydrideperylene and 3-aminopropyl-dimethylethoxysilane, and wherein the silane precursor was purified by solvent precipitation to yield pure product of perylenediimide silane.

PDIB-Nanostructures Synthesis:

Preparation of perylenediimide-functionalized nanostructures was performed by adapting a modified Stöber method from our previous pub lished work (Nanoscale 2012, 4, 4631-4640). As depicted in FIG. 9, PDIB-dimethylethoxysilane was synthesized from 3,4,9,10-tetracarboxyanhydrideperylene and 3-aminopropyl-dimethylethoxysilane. The silane precursor was purified by solvent precipitation to yield pure product of perylenediimide silane (1).

Figure 10:
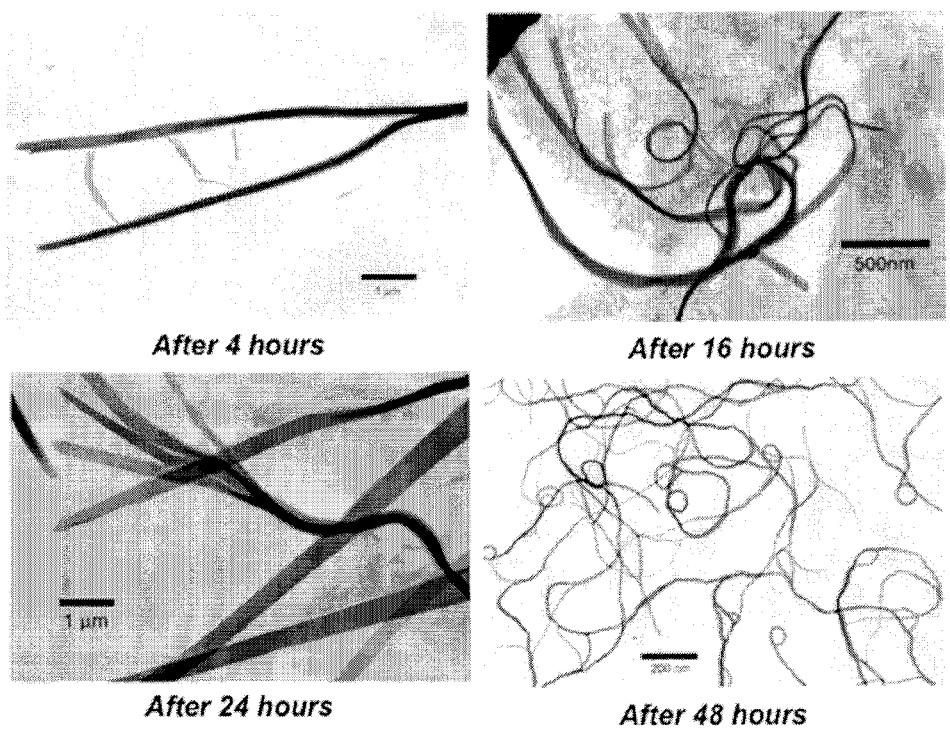
FIG. 10 shows transmission electron micrographs of PDIB-nanoribbons formed at different time intervals, wherein the length of nanoribbons depends on the reaction time.

In a typical procedure, the nanoribbons were prepared by hydrolysis and condensation of PDIB-silane (1) in the presence of NH4OH in anhydrous ethanol: chloroform 10:1 solvent mixture. The nanoribbons formation was examined under transmission electron microscopy (TEM) as a function of time. In each case, nanoribbons were separated by centrifugation and repeated washing with ethanol. FIG. 10 shows TEM images of nanoribbons formed at different time intervals. The length of nanoribbons depends on the reaction time. The longest nanoribbons (excluding tangled ribbons) with length up to 15 μm were obtained after 48 hours of reaction time.

The effect of base concentration for the formation of nanoribbons was studied at the fixed concentration of silane in 10:1 ratio of anhydrous ethanol to chloroform solvent mixture and summarized in Table 4.

TABLE 4

The effect of base concentration on the formation of PDIB-nanoribbons and their morphologies

| Reaction # | Concentration of NH4OH (mol/L) | Dimensions of nanostructures |
| --- | --- | --- |
| 1 | 1.56 | Nanoribbons — width up to 150 nm and length up to 5 μm |
| | | Nanoparticles — Average size up to 30 nm |
| 2 | 1.48 | Nanorods — width 80-100 nm and length up to 5 μm |
| | | Nanoparticles — Average size range 10-100 nm |
| 3 | 2.58 | Nanochains with length up to 2 μm - after 3 hs. Nanorods with spherical nanoparticles on nanorod's surface. Width — 100 -200 nm and length up to 9 μm - after 4 hrs Nanoparticles with the average size range of 20-50 nm - after 48 hrs |

The amount of PDIB silane (1) used for each reaction is 7 × 10$^{-2}$ mmol.

Figure 11:
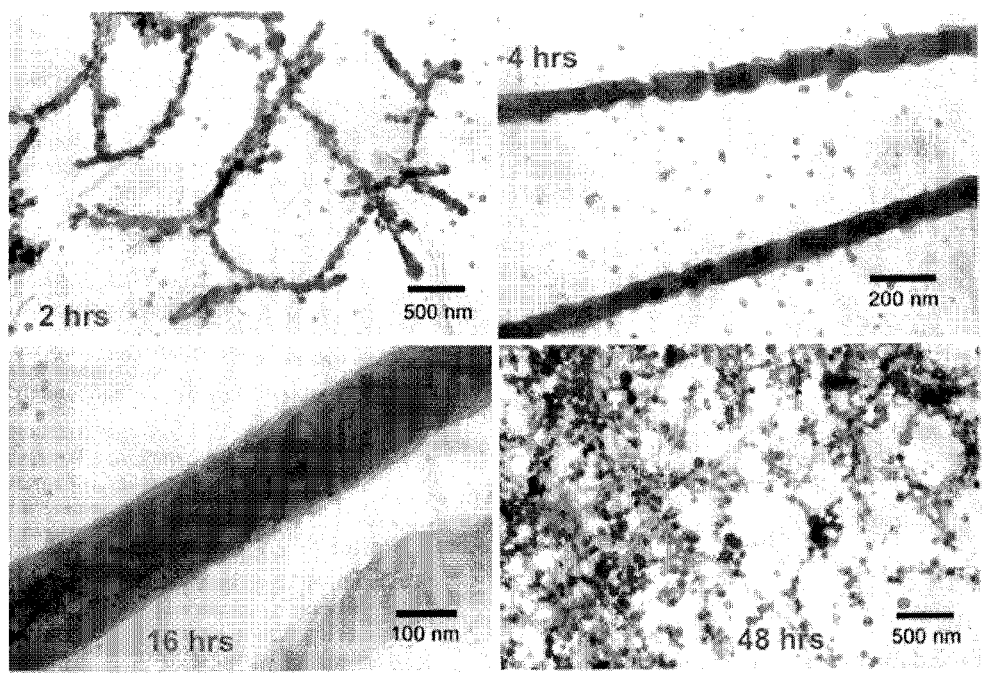
FIG. 11 shows transmission electron micrographs of PDIB-nanostructures formed at high base concentration (2.58 mol/L of base) at various time intervals.
Figure 12:
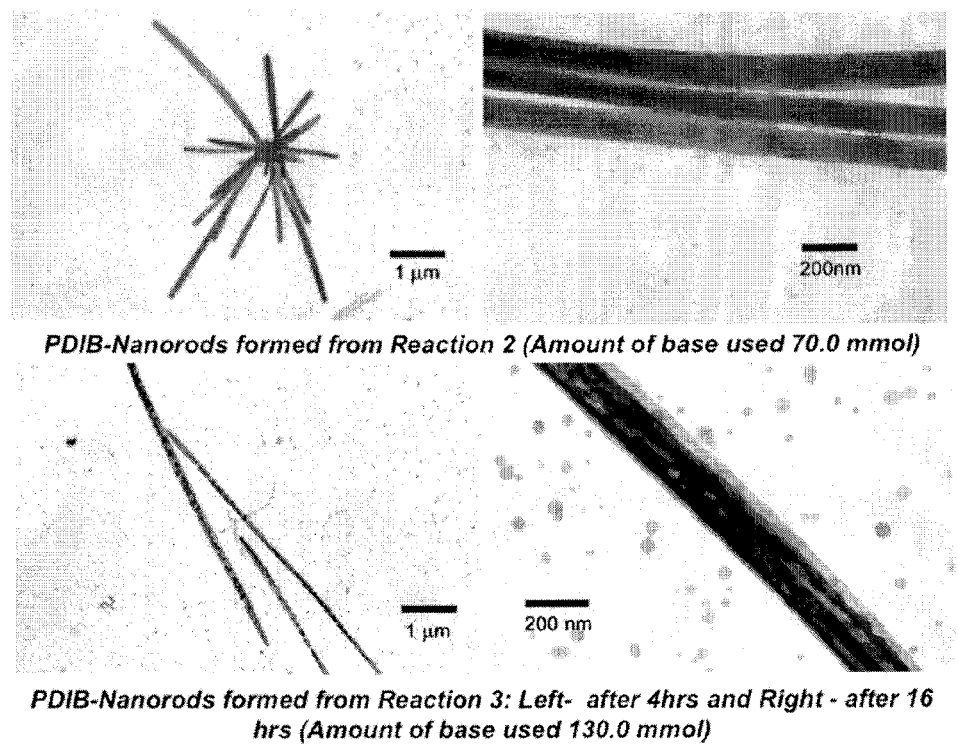
FIG. 12 shows transmission electron micrographs of products from reactions 2 and 3 from Table 4.

These results confirmed that base concentration is directly affecting the formation of nanoribbons. At lower base concentration (1.48 mol/L adjusted by adding 2.5 mL deionized water—reaction 2 in Table 4 and entry V in Table 5), both PDIB-nanorods and spherical nanoparticles were formed. The high base concentration (2.58 mol/L—entry VI in Table 5), gave nanochains to nanorods to nanoparticles depending on the reaction time. The nanoparticles were more abundant after 48 hrs of reaction completions, as shown in FIG. 11. The TEM images reveal that PDIB-nanorods formed at lower base concentration have very smooth surfaces with no spherical nanoparticles present on the nanorod surface. However, nanorods formed at higher base concentration after 16 hrs of reaction time have considerably rougher surfaces with many spherical nanoparticles sticking onto the surface, as shown in FIG. 12.

TABLE 5

Experimental conditions of the trial reactions for the formation of PDIB-nanostructures and their dimensions

| Reaction # | Trials | Concentration of NH4OH (mol/L) | EtOH:CHCl3:H2O solvent (mL) | Dimensions of nanostructures (TEM image #) |
|---|---|---|---|---|
| 1 | I | 1.56 | 150:15:0 | Nanoribbons — width up to 600 nm and average length of untangled ones are in the range of 10-15 μm |
|  | II | 1.56 | 150:15:0 | Nanoribbons — width up to 700 nm and length about 11 μm |
|  | III | 1.56 | 37.5:3.75:0 | Nanoribbons — width 50 to 300 nm and length 6 to 10 μm |
| 2 | IV | 1.47 | 37.5:4:2.5 | Nanorods — width 80-100 nm and length from 2 to 9 μm Nanoparticles — Average size range 15-30 nm |
|  | V | 1.48 | 37.5:3.75:2.5 | Nanorods — width 200-300 nm and length up to 5 μm Nanoparticles — Average size range 15-30 nm |
| 3 | VI | 2.50 | 37.5:3.75:0 | Nanochains with length up to 2 μm. The average size of nanoparticles in the nanochains are ~ 50 nm Nanorods with spherical nanoparticles on nanorod's surface. Width- 50 -150 nm and length 2 to 3 μm Nanoparticles — Average size range 15-30 nm |
|  | VII | 2.09 | 37.5:4:0 | Nanorods with spherical nanoparticles on nanorod's surface. Width- 200 -400 nm and length up to 9 μm Nanochains and hydrolyzed polymer fibers |

The amount of PDIB silane (1) used for each reaction is 7 x 10 -2 mmol.

After running the multiple reactions using these three base concentrations, the TEM results confirmed that the best-suited base concentration for the formation of nanoribbons is 1.56 mol/L per 7×10-2 mmol of PDIB-silane (1) in ethanol to chloroform solvent ratio of 10:1.

Figure 13:
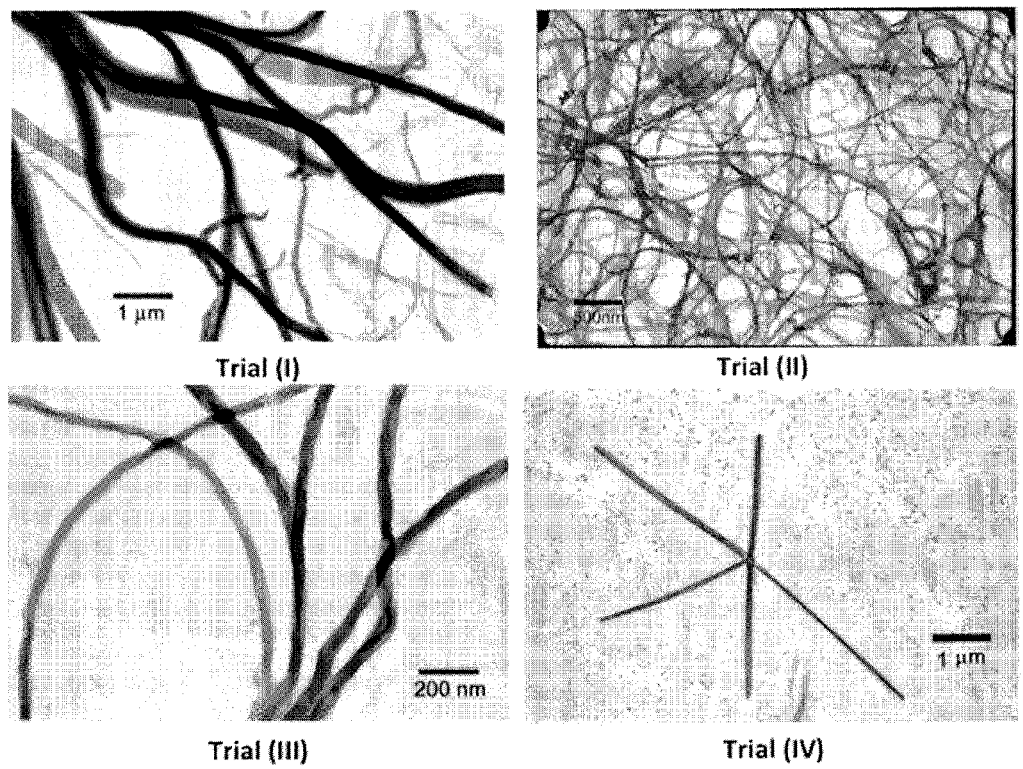
FIG. 13 shows transmission electron micrographs of PDIB-nanoribbons and nanorods with various dimensions.

A series of multiple trial reactions was performed, for which see Table 5, to reproduce the formation of nanoribbons and nanorods using reaction conditions similar to those used for reaction 1 and 2 in Table 4, as shown in FIG. 13. The nanostructures prepared in this manner were isolated after 48 hours and stored as a dry solid and are able to redisperse with little sonication in most organic solvents. TEM analysis confirmed that drying did not affect on either morphology or particle dispersion in organic solvents.

Figure 14:
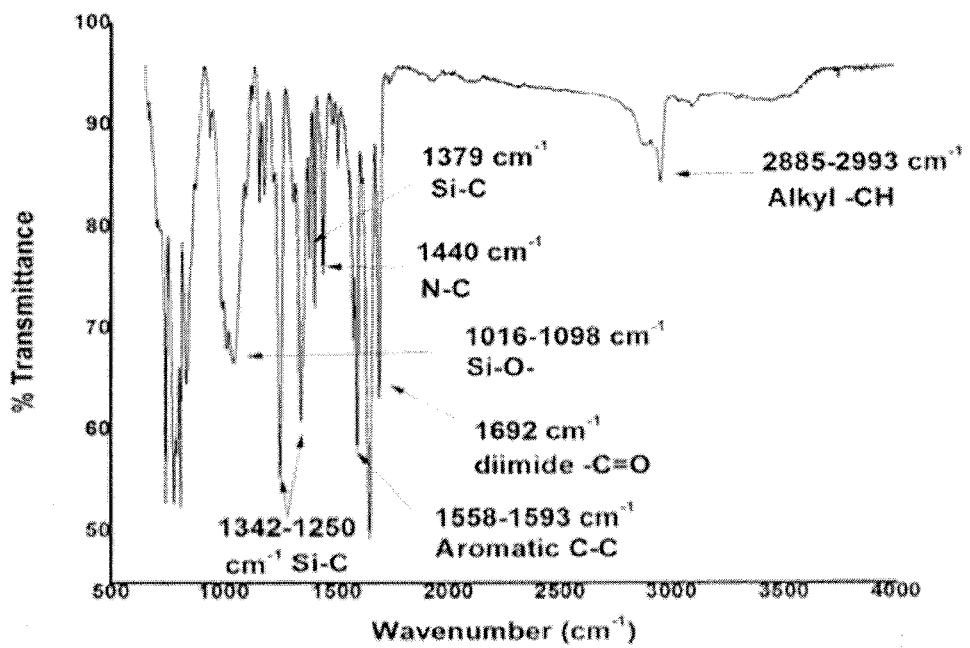
FIG. 14 shows a FTIR spectrum of PDIB-nanoribbons

The FT-IR spectra of PDIB-nanostructures, shown in FIG. 14, confirmed the presence of characteristic bands for the formation of Si—O—Si bonds and the retention of Si—C linkages during the base-catalyzed hydrolysis and condensation reaction. The alkyl chains —CH and diimide carbonyl stretching vibrations were observed at 2993-2885 and 1692 $cm^{-1}$, respectively. The presence of aromatic C—C stretching (1593-1553 $cm^{-1}$) and N—C vibrations (1440 $cm^{-1}$) further supports the successful incorporation of perylenediimide units to the silsesquioxane core. The well-defined absorption at 1343-1253 $cm^{-1}$ confirms the presence of Si—C bonds in Si-PDI units. The absorption of Si—O—Si was observed at 1098-1016 $cm^{-1}$, evidencing the formation of a silsesquioxane network.

Photovoltaic Characterization of PDIB-Nanostructures:

In work from this laboratory such as that described above, nano-sized crystalline PDI nanohybrids were prepared, and the PV performance of the blends of PDIB-NPs and regioregular P3HT polymer ($M_n$=30,000-60,000 g/mol) was evaluated. The reported power conversion efficiency was 1.56%, which was three fold higher than the literature published value for the block copolymer of P3HT and PDI. The focus of further work was inter alia to study the effect of architecture-property relationship of PDIB nanostructures on photovoltaic parameters. Here were evaluated the photovoltaic performances of two different shapes of PDIB-nanostructures using bulk heterojunction device architecture using P3HT as a donor component. The photovoltaic performance of PDIB nanoribbons and nanorods were characterized using the test devices with the device configuration of ITO/PEDOT-.PSS/Blend/Ca-Al. The blends were prepared from the solution of 1:1 mixture of P3HT polymer (Mw=30,000-60,000) and PDIB nanostructures in chlorobenzene. Table 6 summarizes and compared the photovoltaic parameters of the test devices before annealed and after annealed to 100° C. for 5 min.

TABLE 6

Photovoltaic parameters of PDIB-nanoribbons and PDIB-nanorods

| | PV Parameters at RT | | | PV Parameters at 100° C. | | |
|---|---|---|---|---|---|---|
| PDIB | $J_{SC}$ (mA/$cm^2$) | $V_{OC}$ (V) | % PCE | $J_{SC}$ (mA/$cm^2$) | $V_{OC}$ (V) | % PCE |
| Ribbons | 1.77 | 1.01 | 1.02 | 1.77 | >1.0 | 1.02 |
| Rods | 0.92 | 0.26 | 0.11 | 2.19 | 0.60 | 0.64 |

Figure 15:
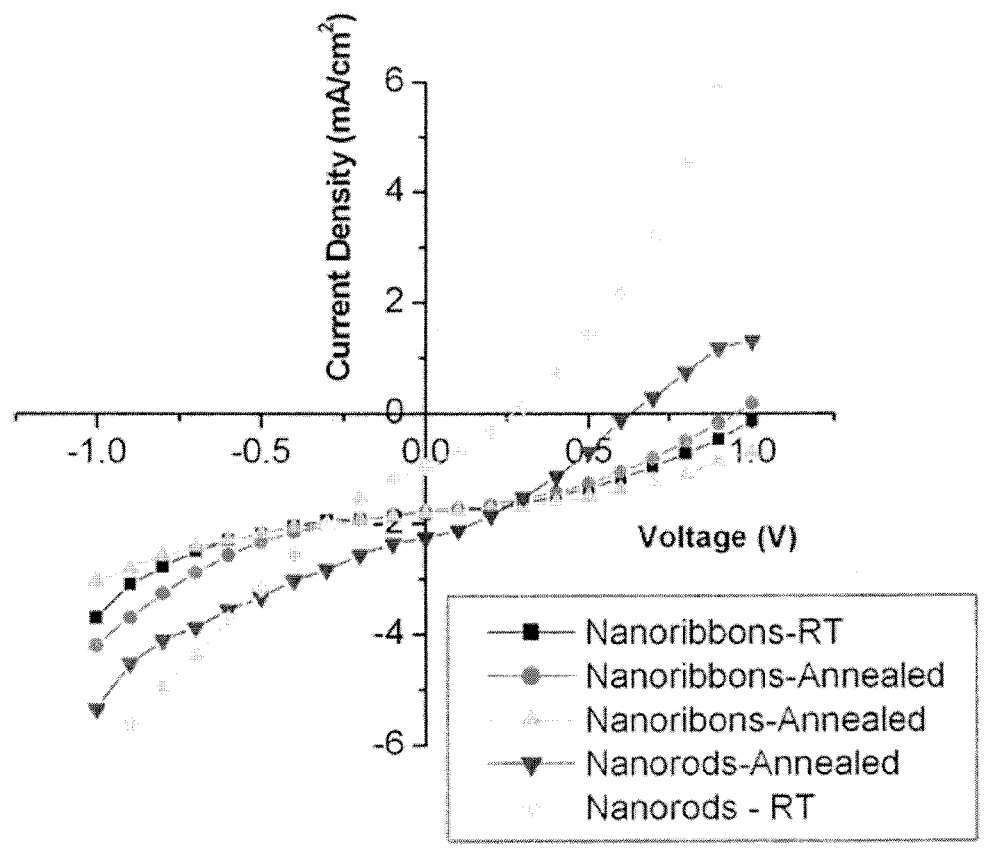
FIG. 15 shows current density vs voltage curves for PDIB-nanoribbons and nanorods at room temperature and after annealing to 100° C. under solar simulator.

Current density—voltage curves for devices made from PDIB-nanostructures are shown in FIG. 15. The test devices made from PDIB-nanoribbons show higher open circuit voltage ($V_{OC}$) with fill factor of 0.42 and short circuit current density ($J_{SC}$) of 1.77 mA/$cm^2$, which did not improve upon annealing the devices to 100° C. Although blend of nanoribbons gave higher $V_{OC}$ the power conversion efficiency was 1.02%, which is 0.56% lower than that of for PDIB-nanoparticles reported in our previous work.[37] One main reason for the poor performance of nanoribbons may be the twisted and tangled nature of ribbons, which lead to unorganized active layer morphology. Also the thickness of nanoribbons may affect to lower the current density, as the donor-acceptor interface thickness is critical for charge separation. The photovoltaic parameters of the devices made from nanorods were also resulted poor performance. The devices of nanorods show power conversion efficiency of 0.64% with $J_{SC}$ of 2.19 mA/cm2 and $V_{OC}$ of 0.60 V after annealed to 100° C. for 5 min. However, PDIB-nanorods gave higher current density compare to nanoribbons since the thickness of nanorods are in the range of 80-100 nm. The fill factor and the $V_{OC}$ of the devices increased to 0.39 and 0.60 V respectively upon annealing to 100° C. for 5 min.

Although it is clear that morphology of PDIB-nanostructures plays an important role on photovoltaic performance, more studies are necessary to comprehensively establish the influence of silsesquioxane core structure and the shapes of PDIB nanostructures on device performance. As it is clear that the thickness of nanostructures clearly have an adverse effect on PV performance, our future studies will focus on controlling the aspect ratio of these nanostructures.

CONCLUSION

Described above are the covalent synthesis of perylenediimide-funtionalized silsesquioxane nanoribbons (PDIB-nanoribbons) and nanorods (PDIB-nanorods) and their optoelectronic properties. Morphology of nanoribbons and nanorods was able to be controlled by variation of base concentration. The synthetic method is sufficiently broad that it enables manufacture of ligand-functionalized nanorods and nanoribbons from an appropriately functionalized dimethyl ethoxysilane precursor Morphologies of these nanostructures show direct impact on PV performance. Incremental increases in power conversion efficiency of P3HT/PDIB blends can be attained through optimization of parameters, as can be undertaken by those skilled in the art.

The foregoing detailed description is provided primarily for clearness of understanding. No unnecessary limitations are to be understood therefrom. To those skilled in the art, modifications will become obvious upon reading the description and may be made without departing from the spirit of the processes, compositions and manufactures described herein in various embodiments and the scope of the appended claims. The figures show several aspects and/or embodiments, including inter alia aspects and/or embodiments of size and shape as relates to the processes, compositions and manufactures described herein in various embodiments. This is not to be considered an exhaustive list of aspects and/or embodiments as are considered to be within the scope of the processes, compositions and manufactures described herein in various embodiments, nor are the examples and/or embodiments of the foregoing verbal description to be considered an exhaustive list of aspects and/or embodiments of the processes, compositions and manufactures described herein in various embodiments, the scope of which is determined solely by the claims and their equivalents.

What is claimed is:

1. A perylenediimide bridged dimethylethoxysilane, wherein silane groups are attached to perylenediimide by an unsubstituted propyl group and the perylene nucleus is unsubstituted.

2. An electronically active nanostructure comprising perylenediimide bridged dimethylethoxysilane, wherein silane groups are attached to perylenediimide by an unsubstituted propyl group and the perylene nucleus is unsubstituted.

3. A process for making perylenediimide bridged dimethylethoxysilane, wherein silane groups are attached to perylenediimide by an unsubstituted propyl group and the perylene nucleus is unsubstituted, the process comprising:
    mixing 3,4,9,10-tetracarboxydianhydrideperylene and anhydrous ethanol to form a first mixture;
    refluxing the first mixture under an argon atmosphere to form a first refluxed mixture;
    mixing 3-aminopropyldimethylethoxysilane with the first refluxed mixture to form a second mixture;
    refluxing the second mixture to form an initial product;
    thereby making perylenediimide bridged dimethylethoxysilane.

4. A process according to claim 3 additionally comprising washing the initial product with hexane and/or ethanol to remove excess 3-aminopropyldimethylethoxysilane, thereby forming a first purified product.

5. A process according to claim 4 additionally comprising dissolving the first purified product in chloroform, thereby forming a first chloroform-containing mixture.

6. A process according to claim 5 additionally comprising separating insoluble solid in the first chloroform-containing mixture from solution in the first chloroform-containing mixture.

7. A process according to claim 6 wherein the separating is effected by centrifugation and/or filtration.

8. A process according to claim 7 wherein the separating is effected by centrifugation and gravity filtration, thereby forming a filtrate.

9. A process according to claim 8 additionally comprising concentrating the filtrate.

10. A process according to claim 9 wherein the concentrating is effected by means of a vacuum.

11. A process for making an electronically active nanoribbon, the process comprising hydrolysis and condensation of perylenediimide bridged dimethylethoxysilane, wherein silane groups are attached to perylenediimide by an unsubstituted propyl group and the perylene nucleus is unsubstituted.

12. A process according to claim 11 wherein the hydrolysis and condensation of perylenediimide bridged dimethylethoxysilane takes place when the perylenediimide bridged dimethylethoxysilane is contacted with ammonium hydroxide.

13. A process according to claim 12 wherein the contact with ammonium hydoxide takes place in an ethanol:chloroform mixture.

14. A process according to claim 13 wherein the ethanol:chloroform mixture is a 10:1 mixture of anhydrous ethanol and chloroform.

15. A process for fabricating a photovoltaic device comprising depositing an electronically active nanostructure, the nanostructure made by hydrolysis and condensation of a perylenediimide bridged dimethylethoxysilane, wherein silane groups are attached to perylenediimide by an unsubstituted propyl group and the perylene nucleus is unsubstituted, onto a substrate.

16. A process according to claim 15 wherein the depositing comprises spraying.

17. A process according to claim 15 wherein a donor chromophore is deposited onto the substrate.

18. A process according to claim 17 wherein the donor chromophore comprises P3HT.

19. A process according to claim 15 wherein poly(3,4-ethylenedioxythiophene)-poly(styrene sulfonate) is deposited onto the substrate.

20. A process according to claim 15 further comprising thermally evaporating a layer of calcium and aluminum onto an electronically active layer that is in contact with the substrate or is connected to the substrate through one or more intermediate layers.

21. A process according to claim 20 further comprising annealing the one or more intermediate layers.

\* \* \* \* \*